United States Patent
Ebihara et al.

(10) Patent No.: US 10,057,902 B2
(45) Date of Patent: Aug. 21, 2018

(54) MODULE WITH DUPLEXERS AND FILTERS

(71) Applicant: TAIYO YUDEN CO., LTD., Tokyo (JP)

(72) Inventors: Hitoshi Ebihara, Tokyo (JP); Naoto Kobayashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 127 days.

(21) Appl. No.: 15/204,759

(22) Filed: Jul. 7, 2016

(65) Prior Publication Data

US 2017/0094662 A1 Mar. 30, 2017

(30) Foreign Application Priority Data

Sep. 24, 2015 (JP) .................................. 2015-187449

(51) Int. Cl.
*H04W 72/04* (2009.01)
*H04L 5/14* (2006.01)
*H03H 7/00* (2006.01)

(52) U.S. Cl.
CPC .......... *H04W 72/0453* (2013.01); *H03H 7/00* (2013.01); *H04L 5/14* (2013.01)

(58) Field of Classification Search
None
See application file for complete search history.

(56) References Cited

U.S. PATENT DOCUMENTS

| 2002/0147014 A1* | 10/2002 | Atarius | H04W 36/18 455/436 |
| 2007/0021080 A1* | 1/2007 | Kuriyama | H04B 1/0057 455/132 |
| 2013/0016632 A1* | 1/2013 | Mujtaba | H04B 7/0608 370/275 |

(Continued)

FOREIGN PATENT DOCUMENTS

| JP | 2015-2395 A | 1/2015 |
| JP | 2015-514381 A | 5/2015 |

(Continued)

OTHER PUBLICATIONS

Japanese Office Action dated Jan. 9, 2018, in a counterpart Japanese patent application No. 2015-187449. (A machine translation (not reviewed for accuracy) attached.).

*Primary Examiner* — Brian Roberts
(74) *Attorney, Agent, or Firm* — Chen Yoshimura LLP

(57) ABSTRACT

A module includes: a first diplexer including a common terminal coupled to a first antenna, a first terminal, and a second terminal; a first duplexer including a common terminal coupled to the first terminal of the first diplexer and allowing transmission and a reception signals of a first band to pass therethrough; a second duplexer including a common terminal coupled to the second terminal of the first diplexer and allowing transmission and reception signals of a second band of which a frequency band is higher than a frequency band of the first band to pass therethrough; and a third duplexer including a common terminal coupled to a second (Continued)

antenna different from the first antenna and allowing transmission and reception signals of a third band of which a frequency band is between the frequency band of the first band and the frequency band of the second band to pass therethrough.

8 Claims, 5 Drawing Sheets

(56) References Cited

U.S. PATENT DOCUMENTS

| | | | |
|---|---|---|---|
| 2013/0028148 A1* | 1/2013 | Heo | H04B 1/005 370/278 |
| 2013/0230080 A1* | 9/2013 | Gudem | H04B 1/0057 375/219 |
| 2013/0273861 A1 | 10/2013 | See | |
| 2014/0003300 A1* | 1/2014 | Weissman | H04B 1/0064 370/273 |
| 2014/0227982 A1* | 8/2014 | Granger-Jones | H04B 7/0404 455/77 |
| 2014/0321312 A1 | 10/2014 | Narahashi et al. | |
| 2014/0329475 A1* | 11/2014 | Ella | H04B 1/006 455/77 |
| 2016/0285505 A1* | 9/2016 | Lee | H04B 1/62 |
| 2017/0077983 A1 | 3/2017 | Ella et al. | |

FOREIGN PATENT DOCUMENTS

| | | |
|---|---|---|
| WO | 2014/010575 A1 | 1/2014 |
| WO | 2014/075099 A1 | 5/2014 |
| WO | 2015/128007 A1 | 9/2015 |

* cited by examiner

MODULE WITH DUPLEXERS AND FILTERS

CROSS-REFERENCE TO RELATED APPLICATION

This application is based upon and claims the benefit of priority of the prior Japanese Patent Application No. 2015-187449, filed on Sep. 24, 2015, the entire contents of which are incorporated herein by reference.

FIELD

A certain aspect of the present invention relates to a module.

BACKGROUND

Communication devices such as mobile phones have expanded their functions including the connection to the Internet. To cope with increase in communication data, technologies such as, for example, Long Term Evolution (LTE)-Advanced have been developed. LTE-Advanced uses Carrier Aggregation (CA) to achieve high throughput.

In Carrier Aggregation, there has been suggested an art that prevents signals from leaking to other paths even when signals in multiple frequency bands are simultaneously transmitted and received as disclosed in, for example, International Publication No. 2014/010575. In addition, there has been suggested an art capable of supporting both communication methods of Diversity and Carrier Aggregation as disclosed in, for example, Japanese Patent Application Publication No. 2015-2395.

However, there has been room for improvement in the loss in a module in which signals in multiple frequency bands are simultaneously transmitted and received.

SUMMARY OF THE INVENTION

According to an aspect of the present invention, there is provided a module including: a first diplexer that includes a common terminal, a first terminal, and a second terminal, the common terminal being coupled to a first antenna; a first duplexer that includes a common terminal coupled to the first terminal of the first diplexer, and allows a transmission signal and a reception signal of a first band to pass therethrough; a second duplexer that includes a common terminal coupled to the second terminal of the first diplexer, and allows a transmission signal and a reception signal of a second band of which a frequency band is higher than a frequency band of the first band to pass therethrough; and a third duplexer that includes a common terminal coupled to a second antenna different from the first antenna, and allows a transmission signal and a reception signal of a third band of which a frequency band is between the frequency band of the first band and the frequency band of the second band to pass therethrough.

DETAILED DESCRIPTION

Hereinafter, embodiments of the present invention will be described with reference to the accompanying drawings.

First Embodiment

Figure 1:
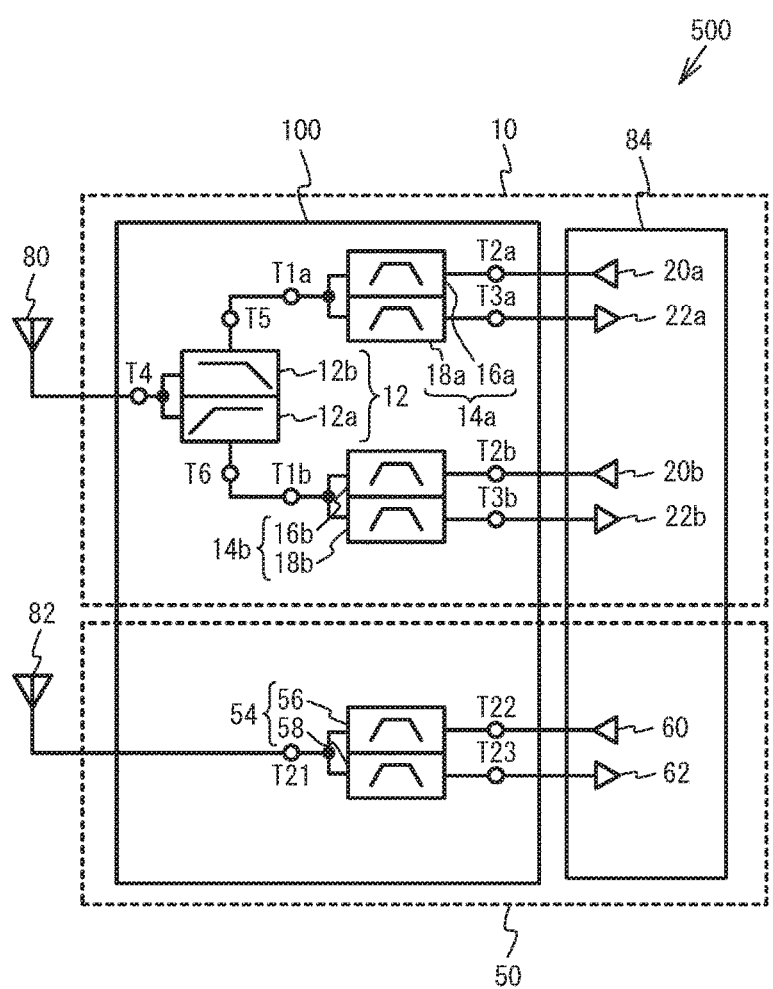
FIG. 1 illustrates a system including a module in accordance with a first embodiment.

FIG. 1 is a system 500 including a module 100 in accordance with a first embodiment. As illustrated in FIG. 1, the system 500 includes the module 100, a first antenna 80, a second antenna 82, and an integrated circuit 84. Hereinafter, a circuit connected to the first antenna 80 is called a first transceiving circuit 10, and a circuit connected to the second antenna 82 is called a second transceiving circuit 50.

The first transceiving circuit 10 includes a diplexer 12, duplexers 14a and 14b, Power Amplifiers (PAs) 20a and 20b, and Low Noise Amplifiers (LNAs) 22a and 22b. The diplexer 12 and the duplexers 14a and 14b are installed in the module 100. The PAs 20a and 20b and the LNAs 22a and 22b are mounted on the integrated circuit 84.

The diplexer 12 includes a High Pass Filter (HPF) 12a and a Low Pass Filter (LPF) 12b. The HPF 12a is connected between a common terminal T4 coupled to the first antenna 80 and a terminal T6. The LPF 12b is connected between the common terminal T4 and a terminal T5.

Figure 2A:
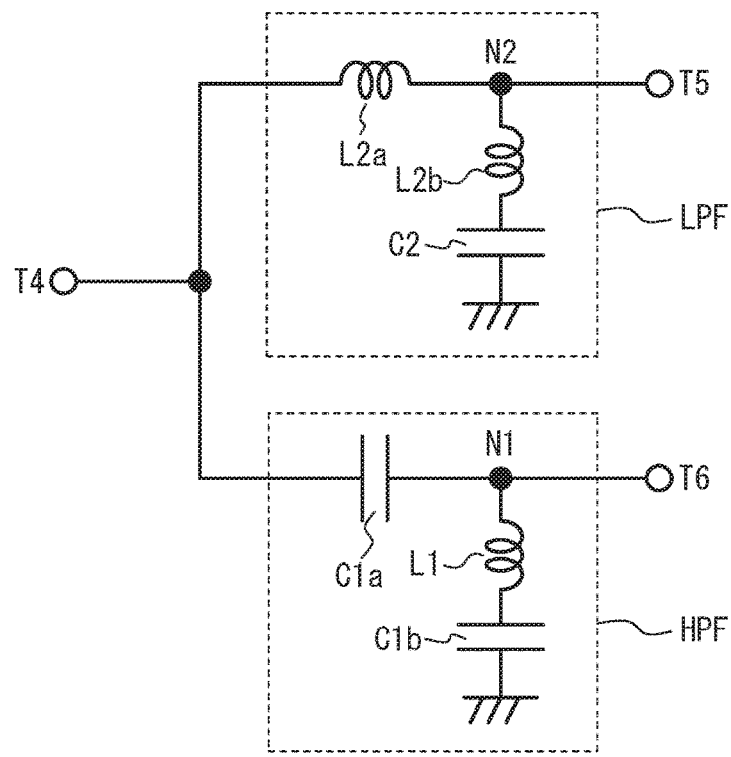
FIG. 2A illustrates an exemplary circuit configuration of a diplexer.
Figure 2B:
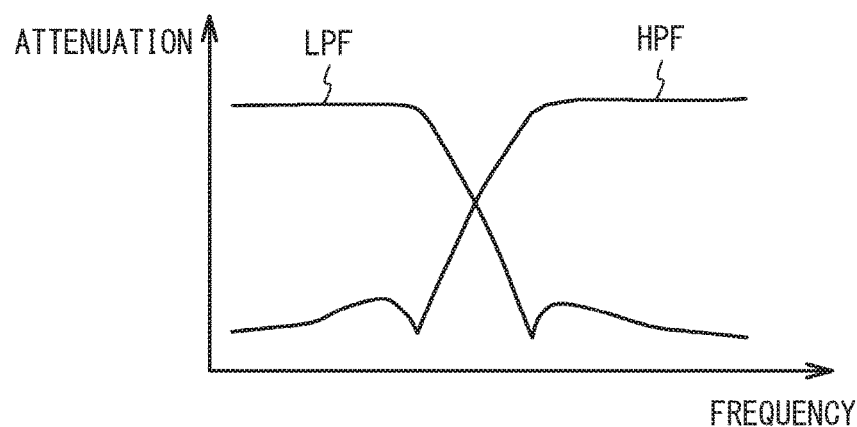
FIG. 2B illustrates the frequency characteristic of the diplexer.

FIG. 2A illustrates an exemplary circuit configuration of the diplexer 12, and FIG. 2B illustrates the frequency characteristic of the diplexer 12. As illustrated in FIG. 2A, the HPF 12a includes a capacitor C1a connected in series between the common terminal T4 and the terminal T6, and an inductor L1 and a capacitor C1b connected in series between a node N1 between the capacitor C1a and the terminal T6 and a ground. The LPF 12b includes an inductor L2a connected in series between the common terminal T4 and the terminal T5, and an inductor L2b and a capacitor C2 connected in series between a node N2 between the inductor L2a and the terminal T5 and a ground.

As illustrated in FIG. 2B, the HPF 12a has large attenuation at low frequencies, and small attenuation at high frequencies. Thus, the HPF 12a allows high-frequency signals to pass therethrough, and suppresses low-frequency signals. In contrast, the LPF 12b has large attenuation at high frequencies, and small attenuation at low frequencies. Thus, the LPF 12b allows low-frequency signals to pass therethrough, and suppresses high-frequency signals.

As illustrated in FIG. 1, the duplexer 14a includes a transmit filter 16a and a receive filter 18a. The duplexer 14b includes a transmit filter 16b and a receive filter 18b. The transmit filters 16a and 16b and the receive filters 18a and 18b are bandpass filters such as, for example, Surface Acoustic Wave (SAW) filters. In the duplexer 14a, the transmit filter 16a is connected between a common terminal T1a and a transmit terminal T2a while the receive filter 18a is connected between the common terminal T1a and a receive terminal T3a. In the duplexer 14b, the transmit filter 16b is connected between a common terminal T1b and a transmit terminal T2b while the receive filter 18b is connected between the common terminal T1b and a receive terminal T3b. The common terminal T1a of the duplexer 14a is coupled to the terminal T5 of the diplexer 12, and the common terminal T1b of the duplexer 14b is coupled to the terminal T6 of the diplexer 12. Therefore, the diplexer 12 and the duplexers 14a and 14b form a quadplexer.

The transmit terminal T2a of the duplexer 14a is coupled to the PA 20a, and the transmit terminal T2b of the duplexer 14b is coupled to the PA 20b. The receive terminal T3a of the duplexer 14a is coupled to the LNA 22a, and the receive terminal T3b of the duplexer 14b is coupled to the LNA 22b.

The PAs 20a and 20b amplify transmission signals. The transmit filters 16a and 16b respectively transmit signals in the transmit band to the common terminals T1a and T1b among transmission signals amplified by the PAs 20a and 20b, and suppress signals in bands other than the transmit band. The receive filters 18a and 18b respectively transmit signals in the receive band to the receive terminals T3a and T3b among reception signals output to the common terminals T1a and T1b, and suppress signals in bands other than the receive band. The LNAs 22a and 22b respectively amplify signals output from the receive filters 18a and 18b.

The duplexers 14a and 14b support various communication systems. For example, the duplexer 14a allows transmission signals and reception signals of Band3 (transmit band: 1710 MHz to 1785 MHz, receive band: 1805 MHz to 1880 MHz) to pass therethrough. The duplexer 14b allows transmission signals and reception signals of Band1 (transmit band: 2500 MHz to 2570 MHz, receive band: 2620 MHz to 2690 MHz) to pass therethrough.

As described above, the duplexer 14b allows transmission signals and reception signals in a frequency band higher than the frequency band of transmission signals and reception signals allowed to pass through the duplexer 14a to pass therethrough. Thus, the HPF 12a making up the diplexer 12 allows transmission signals and reception signals allowed to pass through the duplexer 14b to pass therethrough, and suppresses transmission signals and reception signals allowed to pass through the duplexer 14a. The LPF 12b allows transmission signals and reception signals allowed to pass through the duplexer 14a to pass therethrough, and suppresses transmission signals and reception signals allowed to pass through the duplexer 14b.

The second transceiving circuit 50 includes a duplexer 54, a PA 60, and an LNA 62. The duplexer 54 is installed in the module 100. The PA 60 and the LNA 62 are mounted on the integrated circuit 84. The duplexer 54 includes a transmit filter 56 and a receive filter 58. The transmit filter 56 and the receive filter 58 are bandpass filters such as, for example, SAW filters. The transmit filter 56 is connected between a common terminal T21 and a transmit terminal T22, and the receive filter 58 is connected between the common terminal T21 and a receive terminal T23. The common terminal T21 of the duplexer 54 is coupled to the second antenna 82, the transmit terminal T22 is coupled to the PA 60, and the receive terminal T23 is coupled to the LNA 62.

The transmit filter 56 transmits signals in the transmit band to the common terminal T21 among transmission signals amplified by the PA 60, and suppresses signals in a band other than the transmit band. The receive filter 58 transmits signals in the receive band to the receive terminal T23 among reception signals output to the common terminal T21, and suppresses signals in a band other than the receive band. The LNA 62 amplifies signals output from the receive filter 58.

The duplexer 54 supports various communication systems. For example, the duplexer 54 allows transmission signals and reception signals of Band1 (transmit band: 1920 to 1980 MHz, receive band: 2110 to 2170 MHz) to pass therethrough. As described above, the duplexer 54 allows transmission signals and reception signals in a frequency band between the frequency band of transmission signals and reception signals allowed to pass through the duplexer 14a and the frequency band of transmission signals and reception signals allowed to pass through the duplexer 14b.

In the first embodiment, as illustrated in FIG. 1, the duplexer 14a, which allows transmission signals and reception signals of Band3 (a first band) to pass therethrough, and the duplexer 14b, which allows transmission signals and reception signals of Band7 (a second band) of which the frequency band is higher than that of Band3 to pass therethrough, are coupled to the first antenna 80 through the diplexer 12. Coupled to the second antenna 82 is the duplexer 54 that allows transmission signals and reception signals of Band1 (a third band) of which the frequency band is between the frequency bands of Band3 and Band7 to pass therethrough. As described above, the duplexers 14a and 14b, of which the transmission/reception bands depart from each other, are coupled to the diplexer 12 among the duplexers 14a, 14b and 54. Accordingly, the loss in the diplexer 12 is reduced. The reason will be described with FIG. 3A and FIG. 3B.

Figure 3A:
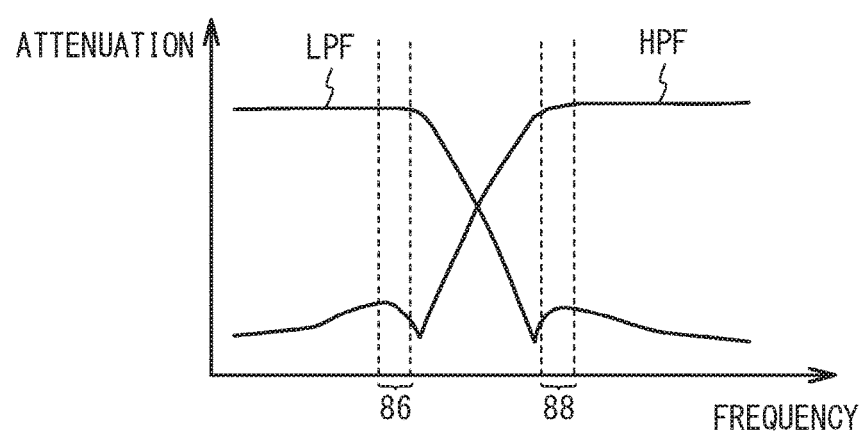
FIG. 3A and FIG. 3B are diagrams for describing a reason why the loss is reduced in the diplexer.
Figure 3B:
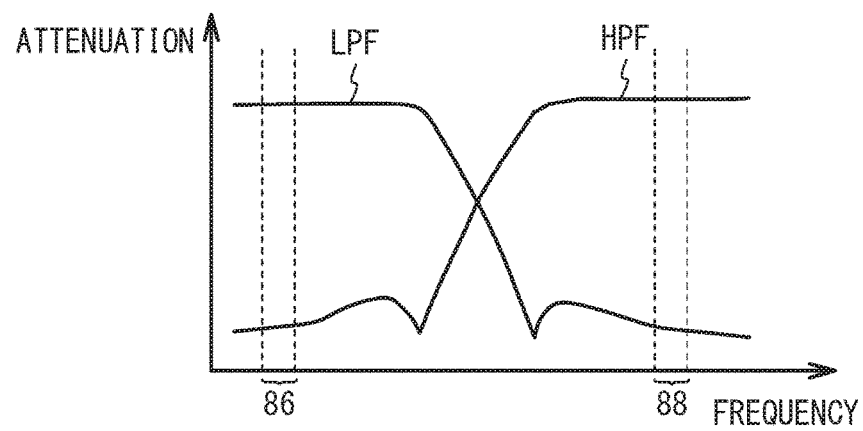

FIG. 3A and FIG. 3B are diagrams for describing the reason why the loss in the diplexer 12 is reduced. The solid lines in FIG. 3A and FIG. 3B indicate the frequency characteristic of the diplexer 12. As illustrated in FIG. 3A, for example, when the transmission/reception bands of the duplexers 14a and 14b are close to each other, a transmission/reception band 86 of the duplexer 14a and a transmission/reception band 88 of the duplexer 14b are located near the intersection between the frequency characteristic of the HPF 12a and the frequency characteristic of the LPF 12b. The transmission/reception band 86 of the duplexer 14a becomes the passband of the LPF 12b and the suppression band of the HPF 12a. The transmission/reception band 88 of the duplexer 14b becomes the passband of the HPF 12a and the suppression band of the LPF 12b. However, since the transmission/reception band 86 of the duplexer 14a and the transmission/reception band 88 of the duplexer 14b are located near the intersection between the frequency characteristic of the HPF 12a and the frequency characteristic of the LPF 12b, the suppression characteristic of the HPF 12a in the transmission/reception band 86 of the duplexer 14a and/or the suppression characteristic of the LPF 12b in the transmission/reception band 88 of the duplexer 14b is insufficient. To achieve sufficient suppression, the loss in the transmission/reception band 86 of the duplexer 14a in the LPF 12b and/or the loss in the transmission/reception band 88 of the duplexer 14b in the HPF 12a increases. In contrast, as illustrated in FIG. 3B, when the transmission/reception bands of the duplexers 14a and 14b are away from each other, the suppression characteristic of the HPF 12a in the transmission/reception band 86 of the duplexer 14a and the suppression characteristic of the LPF 12b in the transmission/reception band 88 of the duplexer 14b can be improved. Therefore, the loss in the transmission/reception band 86 of the duplexer 14a in the LPF 12b and the loss in the transmission/reception band 88 of the duplexer 14b in the HPF 12a can be reduced.

In addition, in the first embodiment, since the duplexers 14a and 14b are coupled to the first antenna 80 through the diplexer 12, and the duplexer 54 is coupled to the second antenna 82, signals in two bands of Band1, Band3, and Band1 can be simultaneously transmitted and received.

Second Embodiment

Figure 4:
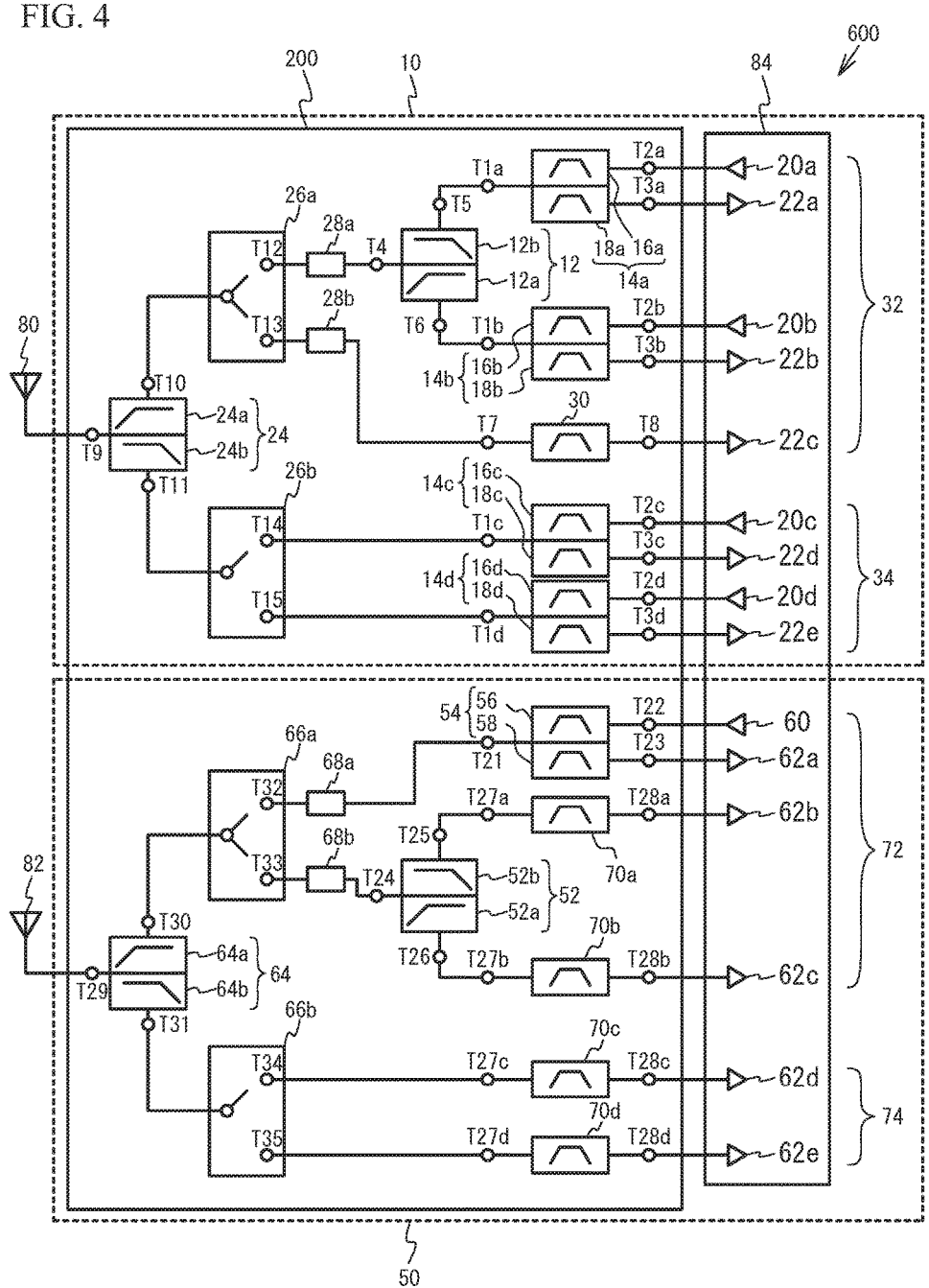
FIG. 4 illustrates a system including a module in accordance with a second embodiment.

A second embodiment is an exemplary module capable of receiving signals by Multi-Input Multi-Output (MIMO). FIG. 4 illustrates a system 600 including a module 200 in accordance with the second embodiment. FIG. 4 simplifies the illustration of wiring lines connected to a diplexer and a duplexer.

As illustrated in FIG. 4, the first transceiving circuit 10 includes a diplexer 24, switches 26a and 26b, phase shifters 28a and 28b, the diplexer 12, duplexers 14a through 14d, a receive filter 30, PAs 20a through 20d, and LNAs 22a through 22e. The diplexer 24, the switches 26a and 26b, the phase shifters 28a and 28b, the diplexer 12, the duplexers 14a through 14d, and the receive filter 30 are installed in the module 200. The PAs 20a through 20d and the LNAs 22a through 22e are mounted on the integrated circuit 84. The switch 26a, the diplexer 12, the duplexers 14a and 14b, the receive filter 30, the PAs 20a and 20b, and the LNAs 22a through 22c form a High Band (HB) transceiving circuit 32 handling HB signals. The switch 26b, the duplexers 14c and 14d, the PAs 20c and 20d, and the LNAs 22d and 22e form a Low Band (LB) transceiving circuit 34 handling LB signals.

The diplexer 24 includes an HPF 24a connected between a common terminal T9 coupled to the first antenna 80 and a terminal T10, and an LPF 24b connected between the common terminal T9 and a terminal T11. The diplexer 24 has the same circuit configuration and the same frequency characteristic as those of FIG. 2A and FIG. 2B. The HPF 24a allows HB signals in the frequency band transmitted and received by the HB transceiving circuit 32 to pass therethrough, and suppresses LB signals in the frequency band transmitted and received by the LB transceiving circuit 34. The LPF 24b allows LB signals in the frequency band transmitted and received by the LB transceiving circuit 34 to pass therethrough, and suppresses HB signals in the frequency band transmitted and received by the HB transceiving circuit 32. In the frequency bands used by mobile phones, frequency bands below 1 GHz are LB bands, and frequency bands equal to or greater than 1.7 GHz are HB bands.

The switch 26a is coupled to the terminal T10 of the diplexer 24, and includes terminals T12 and T13. The switch 26a selects and connects at least one of the terminals T12 and T13 to the first antenna 80. The switch 26b is coupled to the terminal T11 of the diplexer 24, and includes terminals T14 and T15. The switch 26b selects and connects one of the terminals T14 and T15 to the first antenna 80.

The diplexer 12 includes the HPF 12a connected between the common terminal T4 and the terminal T6, and the LPF 12b connected between the common terminal T4 and the terminal T5. The common terminal T4 of the diplexer 12 is coupled to the terminal T12 of the switch 26a through the phase shifter 28a.

The duplexers 14a through 14d respectively include transmit filters 16a through 16d and receive filters 18a through 18d. The transmit filters 16a through 16d and the receive filters 18a through 18d are bandpass filters such as, for example, SAW filters. The transmit filters 16a through 16d are respectively connected between common terminals T1a through T1d and transmit terminals T2a through T2d. The receive filters 18a through 18d are respectively connected between the common terminals T1a through T1d and receive terminals T3a through T3d. The common terminal T1a of the duplexer 14a is coupled to the terminal T5 of the diplexer 12, and the common terminal T1b of the duplexer 14b is coupled to the terminal T6 of the diplexer 12. The common terminal T1c of the duplexer 14c is coupled to the terminal T14 of the switch 26b, and the common terminal T1d of the duplexer 14d is a coupled to the terminal T15 of the switch 26b.

The receive filter 30 is a bandpass filter such as, for example, a SAW filter. An input terminal T7 of the receive filter 30 is coupled to the terminal T13 of the switch 26a through the phase shifter 28b.

The transmit terminals T2a through T2d of the duplexers 14a through 14d are respectively coupled to the PAs 20a through 20d. The receive terminals T3a through T3d of the duplexers 14a through 14d and an output terminal T8 of the receive filter 30 are respectively coupled to the LNAs 22a through 22e.

The transmit filters 16a through 16d respectively transmit signals in the transmit band to the common terminals T1a through T1d among transmission signal amplified by the PAs 20a through 20d, and suppress signals in bands other than the transmit band. The receive filters 18a through 18d respectively transmit signals in the receive band to the receive terminals T3a through T3d among signals output to the common terminals T1a through T1d, and suppress signals in bands other than the receive band. The receive filter 30 transmits signals in the receive band to the output terminal T8 among reception signals output to the input terminal T7, and suppresses signals in bands other than the receive band. The LNAs 22a through 22e respectively amplify signals output from the receive filters 18a through 18d and 30.

The duplexers 14a through 14d and the receive filter 30 support various communication systems. For example, the duplexer 14a allows transmission signals and reception signals of Band3 (transmit band: 1710 MHz to 1785 MHz, receive band: 1805 MHz to 1880 MHz) to pass therethrough. The duplexer 14b allows transmission signals and reception signals of Band1 (transmit band: 2500 MHz to 2570 MHz, receive band: 2620 MHz to 2690 MHz) to pass therethrough. The duplexer 14c allows transmission signals and reception signals of Band8 (transmit band: 880 MHz to 915 MHz, receive band: 925 MHz to 960 MHz) to pass therethrough. The duplexer 14d allows transmission signals and reception signals of Band20 (transmit band: 832 MHz to 862 MHz, receive band: 791 MHz to 821 MHz) to pass therethrough. The receive filter 30 allows reception signals in the receive band (2110 MHz to 2170 MHz) of Band1 to pass therethrough.

As described above, the duplexers 14a and 14b and the receive filter 30 allow signals in the frequency bands equal to or greater than 1.7 GHz to pass therethrough, and the duplexers 14c and 14d allow signals in the frequency bands equal to or less than 1 GHz to pass therethrough. In addition, the duplexer 14b allows transmission signals and reception signals in the frequency band higher than the frequency band of transmission signals and reception signals allowed to pass through the duplexer 14a to pass therethrough. Thus, the HPF 12a making up the diplexer 12 allows transmission signals and reception signals allowed to pass through the duplexer 14b to pass therethrough, and suppresses transmission signals and reception signals allowed to pass through the duplexer 14a. The LPF 12b allows transmission signals and reception signals allowed to pass through the duplexer 14a to pass therethrough, and suppresses transmission signals and reception signals allowed to pass through the duplexer 14b.

The phase shifter 28a has an impedance that allows the diplexer 12 and the duplexers 14a and 14b to be open-circuited when viewed from the switch 26a in the receive band of the receive filter 30 (the receive band of Band1) when the switch 26a simultaneously selects and connects both the terminals T12 and T13 to the first antenna 80. The phase shifter 28b has an impedance that allows the receive filter 30 to be open-circuited when viewed from the switch 26a in the passbands of the duplexers 14a and 14b (the transmit bands and the receive bands of Band3 and Band1) when the switch 26a simultaneously selects and connects both the terminals T12 and T13 to the first antenna 80. This configuration inhibits transmission signals and reception signals passing through the duplexers 14a and 14b from leaking to the receive filter 30, and inhibits reception signals passing through the receive filter 30 from leaking to the duplexers 14a and 14b. Since the switch 26b never simultaneously selects both the terminals T14 and T15, a phase shifter is not coupled to the switch 26b.

Figure 5A:
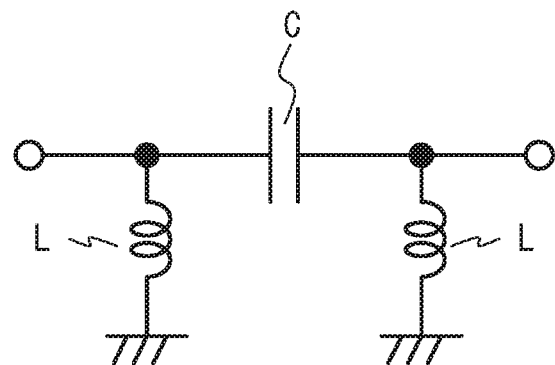
FIG. 5A and FIG. 5B illustrate exemplary circuit configurations of a phase shifter.
Figure 5B:
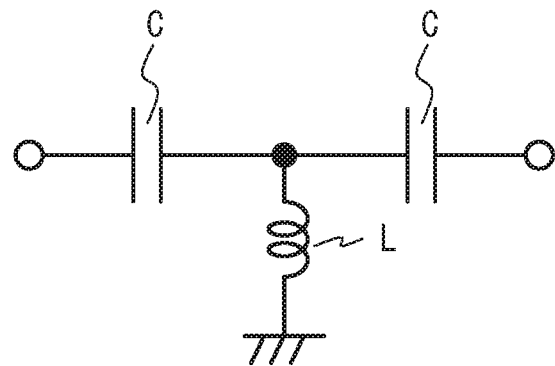

FIG. 5A and FIG. 5B illustrate exemplary circuit configurations of the phase shifters 28a and 28b. The phase shifters 28a and 28b may be a π-type LCL circuit composed of one capacitor C and two inductors L as illustrated in FIG. 5A, or may be a T-type CLC circuit composed of two capacitors C and one inductor L as illustrated in FIG. 5B.

The second transceiving circuit 50 includes a diplexer 64, switches 66a and 66b, phase shifters 68a and 68b, a diplexer 52, the duplexer 54, receive filters 70a through 70d, the PA 60, and LNAs 62a through 62e. The diplexer 64, the switches 66a and 66b, the phase shifters 68a and 68b, the diplexer 52, the duplexer 54, and the receive filters 70a through 70d are installed in the module 200. The PA 60 and the LNA 62a through 62e are mounted on the integrated circuit 84. The switch 66a, the diplexer 52, the duplexer 54, the receive filters 70a and 70b, the PA 60, and the LNAs 62a through 62c form an HB transceiving circuit 72 handling HB signals. The switch 66b, the receive filters 70c and 70d, and the LNAs 62d and 62e form an LB receive circuit 74 handling LB signals.

The diplexer 64 includes an HPF 64a connected between a common terminal T29 coupled to the second antenna 82 and a terminal T30, and an LPF 64b connected between the common terminal T29 and a terminal T31. The HPF 64a and the LPF 64b have the same circuit configurations and the frequency characteristics as those of FIG. 2A and FIG. 2B. The HPF 64a allows HB signals in the frequency band transmitted and received by the HB transceiving circuit 72 to pass therethrough, and suppresses LB signals in the frequency band received by the LB receive circuit 74. The LPF 64b allows LB signals in the frequency band received by the LB receive circuit 74 to pass therethrough, and suppresses HB signals in the frequency band transmitted and received by the HB transceiving circuit 72.

The switch 66a is coupled to the terminal T30 of the diplexer 64, and includes terminals T32 and T33. The switch 66a selects and connects at least one of the terminals T32 and T33 to the second antenna 82. The switch 66b is coupled to the terminal T31 of the diplexer 64, and includes terminals T34 and T35. The switch 66b selects and connects one of the terminals T34 and T35 to the second antenna 82.

The diplexer 52 includes an HPF 52a connected between a common terminal T24 and a terminal T26, and an LPF 52b connected between the common terminal T24 and a terminal T25. The HPF 52a and the LPF 52b have the same circuit configurations and the same frequency characteristics as those of FIG. 2A and FIG. 2B. The common terminal T24 of the diplexer 52 is coupled to the terminal T33 of the switch 66a through the phase shifter 68b.

The duplexer 54 includes the transmit filter 56 connected between the common terminal T21 and the transmit terminal T22, and the receive filter 58 connected between the common terminal T21 and the receive terminal T23. The transmit filter 56 and the receive filter 58 are bandpass filters such as, for example, SAW filters. The common terminal T21 of the duplexer 54 is coupled to the terminal T32 of the switch 66a through the phase shifter 68a.

The receive filters 70a through 70d are bandpass filters such as, for example, SAW filters. An input terminal T27a of the receive filter 70a is coupled to the terminal T25 of the diplexer 52, and an input terminal T27b of the receive filter 70b is coupled to the terminal T26 of the diplexer 52. An input terminal T27c of the receive filter 70c is coupled to the terminal T34 of the switch 66b, and an input terminal T27d of the receive filter 70d is coupled to the terminal T35 of the switch 66b.

The transmit terminal T22 of the duplexer 54 is coupled to the PA 60. The receive terminal T23 of the duplexer 54 and output terminals T28a through T28d of the receive filters 70a through 70d are respectively connected to the LNAs 62a through 62e.

The duplexer 54 and the receive filters 70a through 70d support various communication systems. For example, the duplexer 54 allows transmission signals and reception signals of Band1 (transmit band: 1920 MHz to 1980 MHz, receive band: 2110 MHz to 2170 MHz) to pass therethrough. The receive filter 70a allows reception signals in the receive band of Band3 (1805 MHz to 1880 MHz) to pass therethrough. The receive filter 70b allows reception signals in the receive band of Band1 (2620 MHz to 2690 MHz) to pass therethrough. The receive filter 70c allows reception signals in the receive band of Band8 (925 MHz to 960 MHz) to pass therethrough. The receive filter 70d allows reception signals in the receive band of Band20 (791 MHz to 821 MHz) to pass therethrough.

As described above, the duplexer 54 and the receive filters 70a and 70b allow signals in the frequency bands equal to or greater than 1.7 GHz to pass therethrough, and the receive filters 70c and 70d allow signals in the frequency bands equal to or less than 1 GHz to pass therethrough. In addition, the receive filter 70b allows reception signals in a frequency band higher than the frequency band of reception signals allowed to pass through the receive filter 70a. Thus, the HPF 52a making up the diplexer 52 allows reception signals allowed to pass through the receive filter 70b to pass therethrough, and suppresses reception signals allowed to pass through the receive filter 70a. The LPF 52b allows reception signal allowed to pass through the receive filter 70a to pass therethrough, and suppresses reception signals allowed to pass through the receive filter 70b. In addition, the duplexer 54 allows transmission signals and reception signals in a frequency band between the frequency band of transmission signals and reception signals allowed to pass through the duplexer 14a and the frequency band of transmission signals and reception signals allowed to pass through the duplexer 14b.

The transmit filter 56 transmits signals in the transmit band to the common terminal T21 among transmission signal amplified by the PA 60, and suppresses signals in a band other than the transmit band. The receive filter 58 transmits signals in the receive band to the receive terminal T23 among reception signals output to the common terminal T21, and suppresses signals in a band other than the receive band. The receive filters 70a through 70d respectively transmit signals in the receive band to the output terminals T28a through T28d among reception signals output to the input terminals T27a through T27d, and suppress signals in bands other than the receive band. The LNA 62a through 62e respectively amplify signals output from the receive filters 58 and 70a through 70d.

The phase shifter 68a has an impedance that allows the duplexer 54 to be open-circuited when viewed from the switch 66a in the receive bands of the receive filters 70a and 70b (the receive bands of Band3 and Band 7) when the switch 66a simultaneously selects and connects both the terminals T32 and T33 to the second antenna 82. The phase shifter 68b has an impedance that allows the diplexer 52 and the receive filters 70a and 70b to be open-circuited when viewed from the switch 66a in the passband of the duplexer 54 (the transmit band and the receive band of Band1) when the switch 66a simultaneously selects and connects both the terminals T32 and T33 to the second antenna 82. This configuration inhibits transmission signals and reception signals passing through the duplexer 54 from leaking to the receive filters 70a and 70b, and inhibits reception signals passing through the receive filters 70a and 70b from leaking to the duplexer 54. Since the switch 66b never simultaneously selects both the terminals T34 and T35, no phase shifter is coupled to the switch 66b. The phase shifters 68a and 68b have the same circuit configurations as those of FIG. 5A and FIG. 5B.

The HB transceiving circuits 32 and 72 allow HB signals in one or more frequency bands to be simultaneously transmitted and/or received. This will be described with Table 1 and Table 2. Hereinafter, a mode in which HB signals in two frequency bands are simultaneously transmitted and/or received is called a CA-on mode, and a mode in which only HB signals in one frequency band are transmitted and/or received is called a CA-off mode. Table 1 lists the switching state of the switches 26a and 66a in the CA-on mode. Table 2 lists the switching state of the switches 26a and 66a in the CA-off mode.

With Table 1, described is the CA-on mode in which HB signals in two bands out of Band1, Band3, and Band1 are simultaneously transmitted and/or received.

TABLE 1

|  | Switch 26a | | Switch 66a | |
|---|---|---|---|---|
|  | Terminal T12 | Terminal T13 | Terminal T32 | Terminal T33 |
| Band1, Band3 | ON | ON | ON | ON |
| Band1, Band7 | ON | ON | ON | ON |
| Band3, Band7 | ON | OFF | OFF | ON |

As presented in Table 1, when signals of Band1 and Band3 are simultaneously transmitted, or signals of Band1 and Band3 are simultaneously received, the switch 26a selects and connects both the terminals T12 and T13 to the first antenna 80, and the switch 66a selects and connects both the terminals T32 and T33 to the second antenna 82. Accordingly, the transmission signal of Band3 passes through the transmit filter 16a of the duplexer 14a and is transmitted from the first antenna 80, and the transmission signal of Band1 passes through the transmit filter 56 of the duplexer 54 and is transmitted from the second antenna 82.

The reception signals of Band1 and Band3 are received by both the first and second antennas 80 and 82. The reception signal of Band1 received by the first antenna 80 passes through the receive filter 30 and is output to the LNA 22c, and the reception signal of Band1 received by the second antenna 82 passes through the receive filter 58 of the duplexer 54 and is output to the LNA 62a. The reception signal of Band3 received by the first antenna 80 passes through the receive filter 18a of the duplexer 14a and is output to the LNA 22a, and the reception signal of Band3 received by the second antenna 82 passes through the receive filter 70a and is output to the LNA 62b.

When signals of Band1 and Band7 are simultaneously transmitted, or signals of Band1 and Band7 are simultaneously received, the switch 26a selects and connects both the terminals T12 and T13 to the first antenna 80, and the switch 66a selects and connects both the terminals T32 and T33 to the second antenna 82. Accordingly, the transmission signal of Band7 passes through the transmit filter 16b of the duplexer 14b and is transmitted from the first antenna 80, and the transmission signal of Band1 passes through the transmit filter 56 of the duplexer 54 and is transmitted from the second antenna 82. The reception signal of Band1 received by the first antenna 80 passes through the receive filter 30 and is output to the LNA 22c, and the reception signal of Band1 received by the second antenna 82 passes through the receive filter 58 of the duplexer 54 and is output to the LNA 62a. The reception signal of Band7 received by the first antenna 80 passes through the receive filter 18b of the duplexer 14b and is output to the LNA 22b, and the reception signal of Band7 received by the second antenna 82 passes through the receive filter 70b and is output to the LNA 62c.

In contrast, when signals of Band3 and Band7 are simultaneously transmitted, or signals of Band3 and Band7 are simultaneously received, the switch 26a selects and connects the terminal T12 to the first antenna 80 and does not select the terminal T13, and the switch 66a selects and connects the terminal T33 to the second antenna 82 and does not select the terminal T32. Accordingly, the transmission signal of Band3 passes through the transmit filter 16a of the duplexer 14a and is transmitted from the first antenna 80, and the transmission signal of Band7 passes through the transmit filter 16b of the duplexer 14b and is transmitted from the first antenna 80. The reception signal of Band3 received by the first antenna 80 passes through the receive filter 18a of the duplexer 14a and is output to the LNA 22a, and the reception signal of Band7 received by the first antenna 80 passes through the receive filter 18b of the duplexer 14b and is output from the LNA 22b. The reception signal of Band3 received by the second antenna 82 passes through the receive filter 70a and is output to the LNA 62b, and the reception signal of Band7 received by the second antenna 82 passes through the receive filter 70b and is output to the LNA 62c.

Next, with Table 2, described is the CA-off mode in which only HB signals in one band out of Band1, Band3, and Band7 are transmitted and/or received.

TABLE 2

|  | Switch 26a | | Switch 66a | |
|---|---|---|---|---|
|  | Terminal T12 | Terminal T13 | Terminal T32 | Terminal T33 |
| Band1 | OFF | ON | ON | OFF |
| Band3 | ON | OFF | OFF | ON |
| Band7 | ON | OFF | OFF | ON |

As presented in Table 2, when only signals of Band1 are transmitted and/or received among signals of Band1, Band3, and Band7, the switch 26a selects and connects the terminal T13 to the first antenna 80 and does not select the terminal T12, and the switch 66a selects and connects the terminal T32 to the second antenna 82 and does not select the terminal T33. Accordingly, the transmission signal of Band1 passes through the transmit filter 56 of the duplexer 54 and is transmitted from the second antenna 82. The reception signal of Band1 is received by both the first and second antennas 80 and 82. The reception signal of Band1 received by the first antenna 80 passes through the receive filter 30 and is output to the LNA 22c, and the reception signal of Band1 received by the second antenna 82 passes through the receive filter 58 of the duplexer 54 and is output to the LNA 62a.

When only signals of Band3 are transmitted and/or received among signals of Band1, Band3, and Band7, the switch 26a selects and connects the terminal T12 to the first antenna 80 and does not select the terminal T13, and the switch 66a selects and connects the terminal T33 to the second antenna 82 and does not select the terminal T32. Accordingly, the transmission signal of Band3 passes through the transmit filter 16a of the duplexer 14a and is transmitted from the first antenna 80. The reception signal of Band3 received by the first antenna 80 passes through the receive filter 18a of the duplexer 14a and is output to the LNA 22a, and the reception signal of Band3 received by the second antenna 82 passes through the receive filter 70a and is output to the LNA 62b.

When only signals of Band7 are transmitted and/or received among signals of Band1, Band3, and Band7, the switch 26a selects and connects the terminal T12 to the first antenna 80 and does not select the terminal T13, and the switch 66a selects and connects the terminal T33 to the second antenna 82 and does not select the terminal T32. Accordingly, the transmission signal of Band7 passes through the transmit filter 16b of the duplexer 14b and is transmitted from the first antenna 80. The reception signal of Band7 received by the first antenna 80 passes through the receive filter 18b of the duplexer 14b and is output to the LNA 22b, and the reception signal of Band7 received by the second antenna 82 passes through the receive filter 70b and is output to the LNA 62c.

In the second embodiment, as illustrated in FIG. 4, as in the first embodiment, the duplexer 14a and the duplexer 14b are coupled to the first antenna 80 through the diplexer 12, and the duplexer 54 is coupled to the second antenna 82. This configuration can reduce the loss in the diplexer 12, and allows signals of two bands out of Band1, Band3, and Band7 to be simultaneously transmitted and received.

In addition, the second embodiment provides the switch 26a that includes the terminals T12 and T13 and selects and connects at least one of the terminals T12 and T13 to the first antenna 80, and the switch 66a that includes the terminals T32 and T33 and selects and connects at least one of the terminals T32 and T33 to the second antenna 82. The common terminal T4 of the diplexer 12 to which the duplexer 14a supporting Band3 and the duplexer 14b supporting Band7 are coupled is coupled to the terminal T12 of the switch 26a, and the receive filter 30 supporting Band1 is coupled to the terminal T13 of the switch 26a. The common terminal T21 of the duplexer 54 supporting Band1 is coupled to the terminal T32 of the switch 66a, and the common terminal T24 of the diplexer 52 to which the receive filter 70a supporting Band3 and the receive filter 70b supporting Band7 are coupled is coupled to the terminal T33 of the switch 66a. This configuration allows for reception of signals of Band1, Band3, and Band7 with use of two antennas: the first and second antennas 80 and 82. Thus, throughput and speech quality are improved. For example, speech quality is improved by preferentially using the reception signal from the antenna with stronger incoming signal strength between the first and second antennas 80 and 82 or synthesizing the reception signals from the first and second antennas 80 and 82 to remove noise (so-called diversity).

The first and second embodiments have described exemplary cases where the duplexer 14a supports Band3, the duplexer 14b supports Band7, and the duplexer 54 supports Band1, but do not intend to suggest any limitation. The frequency band of the band supported by the duplexer 54 may be other frequency band as long as it is between the frequency band of the band supported by the duplexer 14a and the frequency band of the band supported by the duplexer 14b.

In the first and second embodiments, the filters may be acoustic wave filters such as boundary acoustic wave filters, Love wave filters, or filters using a piezoelectric thin film resonator, or may be filters other than acoustic wave filters.

Although the embodiments of the present invention have been described in detail, it is to be understood that the various change, substitutions, and alterations could be made hereto without departing from the spirit and scope of the invention.

What is claimed is:

1. A module according, comprising:
   a first diplexer that includes a common terminal, a first terminal, and a second terminal, the common terminal being coupled to a first antenna;
   a first duplexer that includes a common terminal coupled to the first terminal of the first diplexer, and allows a transmission signal and a reception signal of a first band to pass therethrough;
   a second duplexer that includes a common terminal coupled to the second terminal of the first diplexer, and allows a transmission signal and a reception signal of a second band of which a frequency band is higher than a frequency band of the first band to pass therethrough;
   a third duplexer that includes a common terminal coupled to a second antenna different from the first antenna, and allows a transmission signal and a reception signal of a third band of which a frequency band is between the frequency band of the first band and the frequency band of the second band to pass therethrough;
   a first switch that includes a first terminal and a second terminal, and selects and connects at least one of the first terminal and the second terminal to the first antenna, the first terminal being coupled to the common terminal of the first diplexer;
   a second switch that includes a first terminal and a second terminal, and selects and connects at least one of the first terminal and the second terminal to the second antenna, the first terminal being coupled to the common terminal of the third duplexer;
   a second diplexer that includes a common terminal, a first terminal, and a second terminal, the common terminal being coupled to the second terminal of the second switch;
   a first receive filter that is coupled to the first terminal of the second diplexer and allows a reception signal of the first band to pass therethrough;
   a second receive filter that is coupled to the second terminal of the second diplexer and allows a reception signal of the second band to pass therethrough; and
   a third receive filter that is coupled to the second terminal of the first switch and allows a reception signal of the third band to pass therethrough.

2. The module according to claim 1, wherein
   when a signal of the first band and a signal of the second band are simultaneously transmitted, or a signal of the first band and a signal of the second band are simultaneously received, the first switch selects and connects the first terminal of the first switch to the first antenna and does not select the second terminal of the first switch, and the second switch selects and connects the second terminal of the second switch to the second antenna and does not select the first terminal of the second switch.

3. The module according to claim 1, wherein when a signal of the first band and a signal of the third band are simultaneously transmitted, or a signal of the first band and a signal of the third band are simultaneously received, or when a signal of the second band and a signal of the third band are simultaneously transmitted, or a signal of the second band and a signal of the third band are simultaneously received, the first switch selects and connects both the first terminal and the second terminal of the first switch to the first antenna, and the second switch selects and connects both the first terminal and the second terminal of the second switch to the second antenna.

4. The module according to claim 1, wherein when only signals of the first band are transmitted and received among signals of the first band, the second band, and the third band, or only signals of the second band are transmitted and received among signals of the first band, the second band, and the third band, the first switch selects and connects the first terminal of the first switch to the first antenna and does not select the second terminal of the first switch, and the second switch selects and connects the second terminal of the second switch to the second antenna and does not select the first terminal of the second switch, and when only signals of the third band are transmitted and received among signals of the first band, the second band, and the third band, the first switch selects and connects the second terminal of the first switch to the first antenna and does not select the first terminal of the first switch, and the second switch selects and connects the first terminal of the second switch to the second antenna and does not select the second terminal of the second switch.

5. The module according to claim 1, further comprising:
a first phase shifter that is connected between the first terminal of the first switch and the common terminal of the first diplexer;
a second phase shifter that is connected between the second terminal of the first switch and the third receive filter;
a third phase shifter that is connected between the first terminal of the second switch and the common terminal of the third duplexer; and
a fourth phase shifter that is connected between the second terminal of the second switch and the common terminal of the second diplexer.

6. The module according to claim 5, wherein when the first switch selects and connects both the first terminal and the second terminal of the first switch to the first antenna, the first phase shifter has an impedance that allows the first duplexer and the second duplexer to be open-circuited when viewed from the first switch in a frequency band of the third band, and the second phase shifter has an impedance that allows the third receive filter to be open-circuited when viewed from the first switch in the frequency bands of the first band and the second band, and when the second switch selects and connects both the first terminal and the second terminal of the second switch to the second antenna, the third phase shifter has an impedance that allows the third duplexer to be open-circuited when viewed from the second switch in the frequency bands of the first band and the second band, and the fourth phase shifter has an impedance that allows the first receive filter and the second receive filter to be open-circuited when viewed from the second switch in the frequency band of the third band.

7. The module according to claim 1, wherein the first band, the second band, and the third band are frequency bands equal to or greater than 1.7 GHz.

8. The module according to claim 1, wherein the first band is Band3, the second band is Band7, and the third band is Band1.

* * * * *